United States Patent [19]

Ooishi

[11] Patent Number: 5,751,627
[45] Date of Patent: May 12, 1998

[54] MEMORY CELL THAT CAN STORE DATA NONVOLATILY USING A FERROELECTRIC CAPACITOR, AND A SEMICONDUCTOR MEMORY DEVICE INCLUDING SUCH A MEMORY CELL

[75] Inventor: Tsukasa Ooishi, Hyogo, Japan

[73] Assignee: Mitsubishi Denki Kabushiki Kaisha, Tokyo, Japan

[21] Appl. No.: 786,378

[22] Filed: Jan. 17, 1997

Related U.S. Application Data

[63] Continuation of Ser. No. 576,353, Dec. 21, 1995, abandoned.

[30] Foreign Application Priority Data

Dec. 26, 1994 [JP] Japan ................................ 6-322741

[51] Int. Cl.$^6$ .................................................. G11C 11/22
[52] U.S. Cl. ............................ 365/145; 365/149; 365/200
[58] Field of Search ........................... 365/145, 149, 365/200

[56] References Cited

U.S. PATENT DOCUMENTS

| | | | |
|---|---|---|---|
| 4,809,225 | 2/1989 | Dimmler et al. | 365/145 |
| 4,974,204 | 11/1990 | Miller | 365/145 |
| 5,293,348 | 3/1994 | Abe | 365/200 X |
| 5,434,811 | 7/1995 | Evans, Jr. et al. | 365/145 |

FOREIGN PATENT DOCUMENTS 64-66899   3/1989   Japan .

*Primary Examiner*—Son T. Dinh
*Attorney, Agent, or Firm*—Lowe, Price, LeBlanc & Becker

[57] ABSTRACT

In a bistable memory element including a first inverting circuit of an N channel MOSFET and a P channel MOSFET, and a second inverting circuit of an N channel MOSFET and a P channel MOSFET, a memory cell is formed of a first ferroelectric capacitor having one end coupled to the input of the first inverting circuit and the other end coupled to a fixed potential $V_{CP}$ and a second ferroelectric capacitor having one end coupled to the input of the second inverting circuit and the other end coupled to the fixed potential $V_{CP}$. Since the fixed potential $V_{CP}$ can be varied to an arbitrary value by an external signal, the intensity of the electric field applied to the ferroelectric capacitor can be set to an arbitrary value.

12 Claims, 12 Drawing Sheets

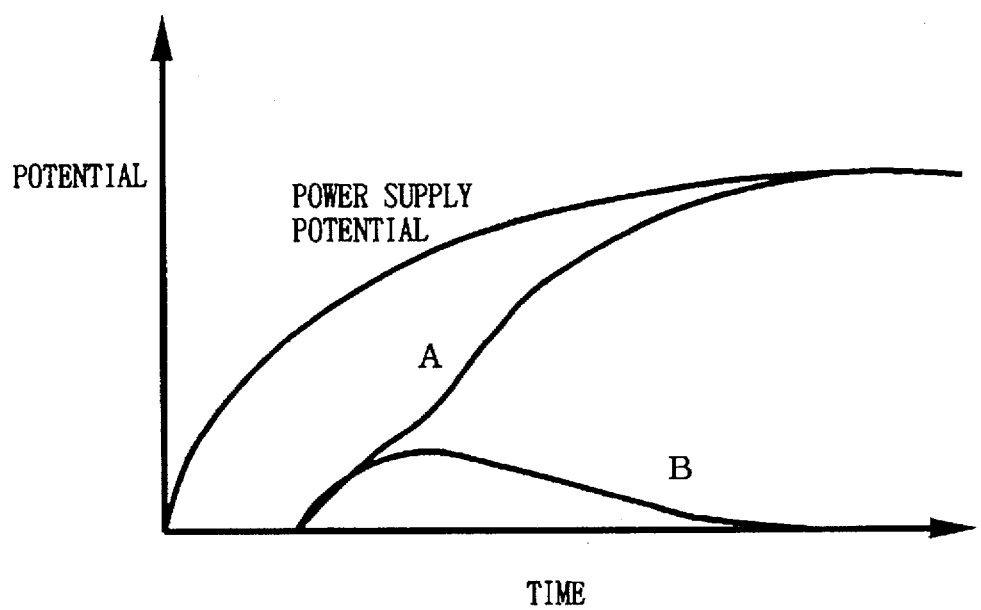

MEMORY CELL THAT CAN STORE DATA NONVOLATILY USING A FERROELECTRIC CAPACITOR, AND A SEMICONDUCTOR MEMORY DEVICE INCLUDING SUCH A MEMORY CELL

This application is a continuation of application Ser. No. 08/576,353 filed Dec. 21, 1995 abandoned.

BACKGROUND OF THE INVENTION

1. Field of the Invention

The present invention relates to a ferroelectric capacitor memory cell and a semiconductor memory device including such a memory cell. More particularly, the present invention relates to a memory cell that stores information according to the direction of polarization of ferroelectrics and a semiconductor memory device including such a memory cell.

2. Description of the Background Art

Most of the generally used semiconductor memory devices are a dynamic type RAM (referred to as DRAM hereinafter) or a static type RAM (referred to as SRAM hereinafter).

This difference lies in the structure of the memory cell forming the RAM.

In a memory cell of a DRAM, data is stored in a capacitor formed on a semiconductor substrate. One transistor selectively couples a bit line that is the interconnection carrying out data reading or writing with one capacitor. By virtue of such a simple structure of one transistor/one capacitor, memory cells of a DRAM are suitable for integration in a small area and at high density.

In a DRAM, information charge is stored in a capacitor on a semiconductor substrate which is gradually lost by various leakage. Therefore, a refresh operation must be carried out periodically to read out and then rewrite the data before it is lost.

The SRAM differs from the DRAM in that the memory cell does not have to be subjected to a refresh operation. The cell of a SRAM includes a plurality of transistors formed as a bistable flip-flop. Two different levels of binary data are stored according to the two states of the flipflop.

The size of a SRAM cell is greater than that of a DRAM cell since the SRAM cell includes a plurality of transistors. Therefore, memory cells cannot be installed at high density on a semiconductor chip in a SRAM.

It is also known that a SRAM operates at high speed and does not require a logic circuit for a refresh process.

Although a DRAM has the advantage of allowing high speed writing/reading, it has a disadvantage of being volatile. More specifically, the data is erased from the memory when the power is turned off.

In a DRAM, the charge stored in a capacitor in a memory cell is gradually reduced due to a leakage current or the like, so that the stored information will be lost.

In a SRAM, the voltage for maintaining the flipflop state in a memory cell is lowered to 0, so that the flipflop will lose its data.

According to the above disadvantages, DRAMs and SRAMs are not suitable for programs and for storing data for a long time period.

In order to overcome such disadvantages, the so-called nonvolatile semiconductor memory was developed. Various principles of a nonvolatile semiconductor memory device has been proposed.

Among these various nonvolatile semiconductor memories, the so-called EEPROM (Electrically Erasable and Programmable Read Only Memory) is particularly superior in that the stored information can be electrically written or erased.

However, a circuit that generates high voltage must be incorporated on the chip in order to introduce/draw out electrons into/from a floating gate using a tunneling current through a thin insulating film for writing/erasing. Furthermore, the size of the memory is increased since the area for a select transistor and the tunnel region is required.

In contrast, storage can be carried out in a nonvolatile manner by forming a capacitor with ferroelectrics such as PZT ($PbZrTio_3$) and taking advantage of change in the charging/discharging characteristics of the capacitor according to the direction of polarization.

FIG. 14 shows a circuit diagram of a memory cell utilizing a ferroelectric capacitor disclosed in Japanese Patent Laying-Open No. 64-66899.

Referring to FIG. 14, a memory cell 10 includes first and second units 12 and 14.

First unit 12 includes a volatile memory. Second unit 14 includes a circuit with a ferroelectric device coupled to first unit 12.

First unit 12 includes a flipflop of two N channel MOSFETs 16 and 18 and two P channel MOSFETs 20 and 22.

In a general operation mode, transistors 32 and 34 are turned off, so that first and second units 12 and 14 are electrically disconnected. As a result, first unit 12 operates as a general SRAM memory cell. Transistors 40 and 42 are turned on to protect ferroelectric capacitors 36 and 38 from DC noise and the like.

When the stored information in first unit 12 to be transferred to second unit 14, transistors 40 and 42 are turned off and transistors and 32 ad 34 are turned on. In order to simplify the description of this operation, it is assumed that node A attains an H level (logical high), i.e. potential $V_{CC}$, and node B attains an L level (logical low), i.e. the ground potential, in FIG. 14.

It is also assumed that the ferroelectric capacitor is polarized in the direction of the dotted line arrow in FIG. 14 at the initial state. More specifically, this direction of polarization is opposite to the direction of polarization by the potential of nodes A and B.

At the initial state of transfer, signal CLK2 attains the level of the ground potential. Therefore, when transistor 32 is turned on, ferroelectric capacitor 36 has the direction of polarization reversed towards the direction indicated by the solid line arrow.

This operation will be described with reference to the graph of FIG. 15 in which electric field E is plotted along the abscissa and polarization P is plotted along the ordinate. Ferroelectric capacitor 36 attains the polarization of state "a". Upon the application of an electric field, the state of polarization exhibits a transition to state "d".

The direction of polarization of capacitor 38 does not change from the state indicated by the dotted line arrow since no electric field is applied between the opposing electrodes just by transistor 34 being turned on.

Then, signal CLK2 is pulled up to an H level. Here, capacitor 36 shows a transition to state "c" from state "d" in FIG. 15. In contrast, capacitor 38 shows a transition from state "c" to "b".

Finally, signal CLK2 is restored to the level of ground potential, whereby capacitor 38 shows a transition from state "b" to "a".

According to the above operation, ferroelectric capacitors 36 and 38 are polarized in a direction opposite to that of the initial state.

There are various methods of restoring the stored information of the second unit into the first unit. A typical example thereof will be described hereinafter.

First, transistors 24 and 26 are turned on to connect bit arrays 28 and 38, so that nodes A and B are preset to the level of ground potential.

Then, while transistors 24 and 26 are turned off to set signal CLK1 at the ground potential, transistors 32 and 34 are turned on to drive signal CLK2 to the level of the power supply potential from the ground potential.

Here, a voltage is supplied in a direction opposite to the direction of polarization in capacitor 36.

As shown in FIG. 16, application of a voltage in a direction opposite to the direction of the polarization causes a current flow greater in amount than the opposite case. Therefore, the potential of node A becomes higher than that of node B. Here, by driving signal CLK1 to the level of the power supply potential from the ground level, nodes A and B are stabilized at the level of H and L, respectively.

Since the direction of polarization of the ferroelectric capacitor is changed only when necessary in the conventional case, the fatigue of the ferroelectric film is not considerable.

However, a memory cell using a conventional ferroelectric capacitor is increased in the circuit complexity in order to alleviate the polarization fatigue of the ferroelectrics. There was also a problem that the peripheral circuit is also increased in circuit complexity in order to control the operation by a plurality of timing signals.

SUMMARY OF THE INVENTION

An object of the present invention is to provide a memory cell of nonvolatile semiconductor memory device using a ferroelectric capacitor.

Another object of the present invention is to provide a semiconductor memory device that can read out stored information with a simple circuit operation and at high accuracy when a ferroelectric capacitor is used as a nonvolatile memory cell.

A further object of the present invention is to provide a circuit in which an nonvolatile memory including a memory cell using the above ferroelectric capacitor is applied to a circuit conventionally using another nonvolatile memory or a volatile memory for simplifying the operation of the nonvolatile memory and rendering stored information nonvolatile which was conventionally lost every time power was turned off.

In accordance with the present invention, a memory cell that can store information in an nonvolatile manner includes a bistable memory element, a node to which to a fixed potential is supplied, a first ferroelectric capacitor, and a second ferroelectric capacitor.

The bistable memory element includes a first inverting circuit, and a second inverting circuit having an output and an input coupled to an input and an output, respectively, of the first inverting circuit. The first ferroelectric capacitor has one end coupled to an input of an first inverting circuit and the other end coupled to the node to which the fixed potential is supplied. The second ferroelectric capacitor has one end coupled to the input of the second inverting circuit and the other end coupled to the node to which the fixed potential is supplied.

According to another aspect of the present invention, a memory cell that can store information in an nonvolatile manner includes a bistable memory element and a ferroelectric capacitor.

The bistable memory element includes a first inverting circuit, and a second inverting circuit having an output and an input connected to an input and an output, respectively, of the first inverting circuit. The ferroelectric capacitor has one end coupled to the input of the first inverting circuit, and the other end coupled to the input of the second inverting circuit.

According to further aspect of the present invention, a memory cell in a semiconductor memory device storing information according to the direction of spontaneous polarization of ferroelectrics includes first and second ferroelectric capacitors, a polarization circuit, a first path, a second path, and a potential difference detection circuit. The first and second ferroelectric capacitors have each one end connected to a first potential. The polarization circuit polarizes the first and second ferroelectric capacitors in a direction complementary to each other. The first path includes first and second constant current sources connected in series to each other. The first ferroelectric capacitor has the other end connected to the connection node of the two constant current sources. The second path includes third and fourth constant current sources connected in series to each other. The second ferroelectric capacitor has the other end connected to the connection node of the two constant current sources. The first and second paths further include a circuit for maintaining the current flowing through the second and fourth constant current sources in the paths at equal level. The potential difference detection circuit detects the difference in the potential of the node of the first and second constant current sources from the potential of the node of the third and fourth constant current sources.

A main advantage of the present invention is that stored information is not lost even when power is turned off since the stored information in the bistable memory element polarizes the ferroelectric capacitor.

Since the voltage applied to each ferroelectric capacitor can be set at a desired value by an external fixed potential, the electric field applied to the ferroelectric film can be reduced to improve the fatigue characteristics of the polarization of the ferroelectric film.

Another advantage of the present invention is that a memory cell is realized with a simple structure and with no loss of stored information even when power is turned off when used in an application where stored information in a memory cannot be rewritten frequently or when used at a state where the supply voltage is sufficiently low.

A further advantage of the present invention is that information stored in a ferroelectric capacitor can be read out at high accuracy with a circuit of a relatively simple configuration and operation since information stored by first and second ferroelectric capacitors having complementary direction of polarization is read out by amplifying the potential difference generated by difference in the charging characteristics when a constant current is conducted to the first and second ferroelectric capacitors.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 shows an operation of the first embodiment of the present invention.

DESCRIPTION OF THE PREFERRED EMBODIMENTS

Figure 1:
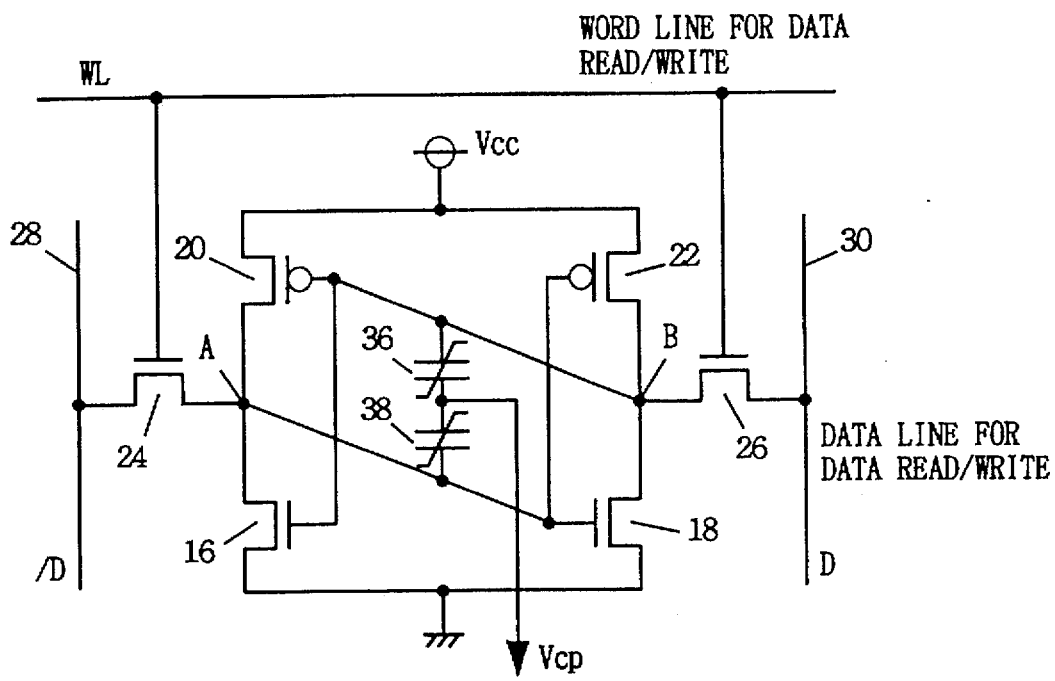
FIGS. 1 and 2 are circuit diagrams showing first and second embodiments, respectively, of the present invention.

FIG. 1 is a circuit diagram showing a structure of a memory cell according to a first embodiment of the present invention.

Similar to a conventional memory cell, the memory cell of FIG. 1 includes a flipflop formed of two N channel MOSFETs 16 and 18 and two P channel MOSFETs 20 and 22.

First ferroelectric capacitor 38 has one end coupled to an output of an inverter formed of P channel MOSFET 20 and N channel MOSFET 16, and the other end coupled to a fixed potential $V_{CP}$.

Second ferroelectric capacitor 36 has one end coupled to the output of an inverter formed of P channel MOSFET 22 and N channel MOSFET 18, and the other end coupled to fixed potential $V_{CP}$.

FIG. 3 is a diagram showing an operation of the present embodiment. In the present embodiment, a capacitor of a ferroelectric material is arranged between nodes A and B in FIG. 1. An opposing electrode thereof is connected to fixed potential $V_{CP}$. By driving the driving a potential of word line WL to an H level to turn on transistors 24 and 26, the ferroelectric capacitor changes the direction of polarization in response to the information of an H level or an L level written by complementary potential data lines D and /D for a fixed potential. This polarization is maintained even after power is turned off.

At a subsequent power on, the degree of increase in the potential of nodes A and B differ due to the maintained polarization.

Figure 14:
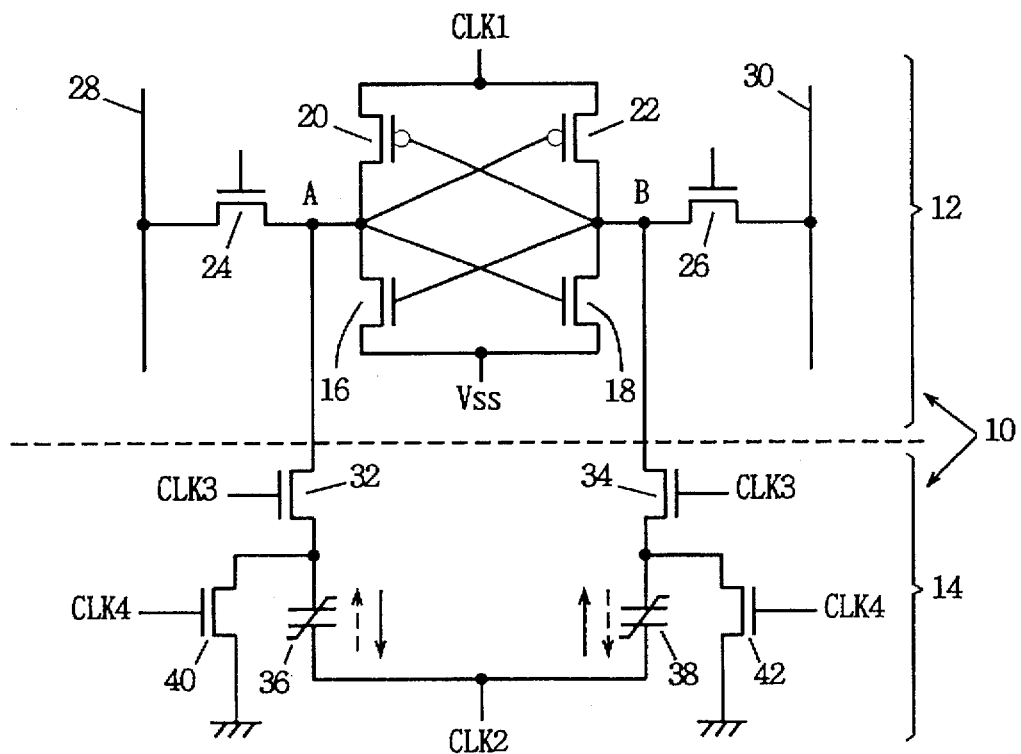
FIG. 14 is a circuit diagram showing a conventional memory cell.
Figure 15:
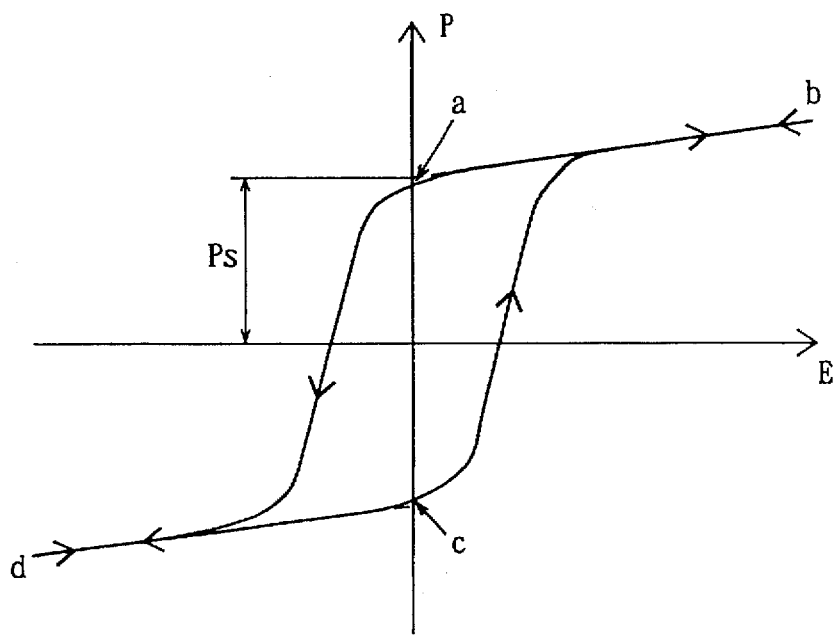
FIG. 15 shows the dielectric characteristics of ferroelectrics.

When data of an H level and an L level are written into nodes A and B, respectively, at the previous term of power on, node A at the subsequent power on corresponds to the case where a voltage is supplied in a direction identical to the direction of the electrode in FIG. 14, so that the amount of current flow is small. Therefore, polarization is detected in the direction of the great increase in the potential. In contrast to node A, node B has a great amount of current flow, resulting in polarization in a direction of a small increase in potential. Thus, there is a difference in the potential increase between nodes A and B. This imbalance causes the bistable element to act in the direction of further amplifying the potential, whereby the preheld information is directly reproduced.

At FIG. 3, a waveform at the time of power on in the present embodiment is shown. It is assumed that data of an H level and an L level are written into nodes A and B, respectively, at the preceding term of power on. The potential difference between nodes A and B becomes greater as a function of increase in the power supply potential. In accordance with increase of the power supply potential, the bistable element initiates its amplification, whereby nodes A and B are amplified towards the power supply potential and the ground potential, respectively.

Thus, according to the present structure, a rewriting operation is not necessary for the memory cell.

Here, by taking a value of ½ the power supply potential $V_{CC}$ as fixed potential $V_{CP}$, the voltage applied on ferroelectric capacitors 36 and 38 becomes $V_{CC}/2$, which is half the conventional voltage. Therefore, the fatigue characteristics of the ferroelectric capacitor can be improved significantly.

Although this memory cell is the so-called CMOS type cell, a similar effect can be obtained in an NMOS load type cell or resistance load type cell.

Figure 4A:
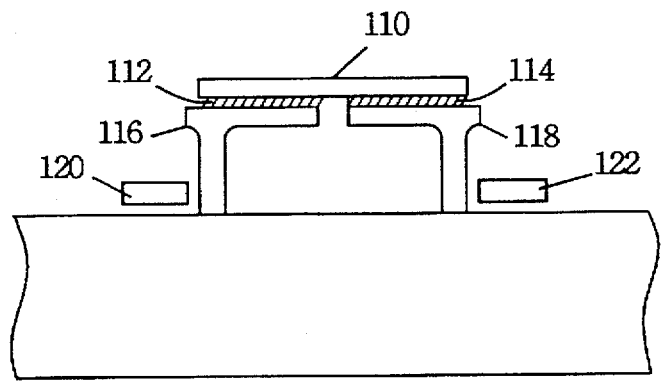
FIGS. 4A and 4B show the first embodiment of the present invention.
Figure 4B:
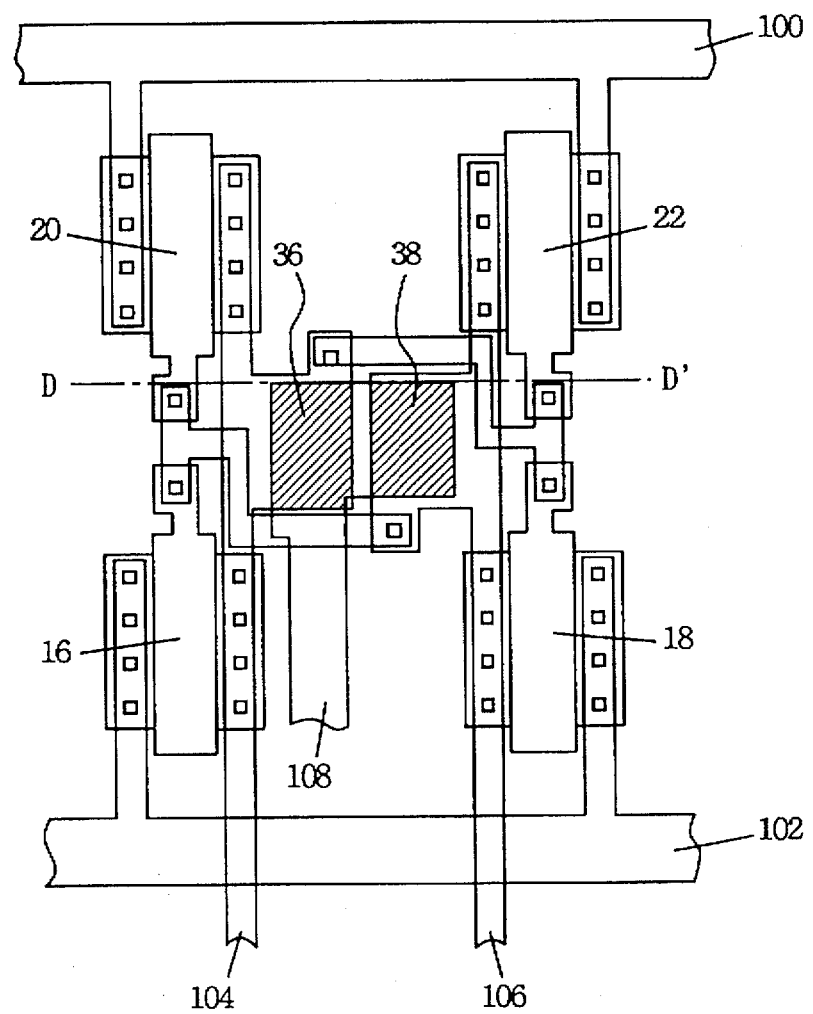

FIG. 4B is a plan view and FIG. 4A is a sectional view taking along line D–D' of FIG. 4B of the first embodiment.

The interconnections connecting each drain of P channel MOSFETs 20, 22 and N channel MOSFETs 16, 18 with each other and drawn out as output nodes 104 and 106 are shared as lower electrodes 116 and 118, of ferroelectric capacitors 36 and 38, respectively.

A ferroelectric film formed on the interconnection is patterned to serve as respective dielectric films 112 and 114 of capacitors 36 and 38. An upper electrode 110 is formed on dielectric films 112 and 114. The electrode metal of upper electrode 110 is coupled to fixed potential $V_{CP}$ as an interconnection 108.

Figure 2:
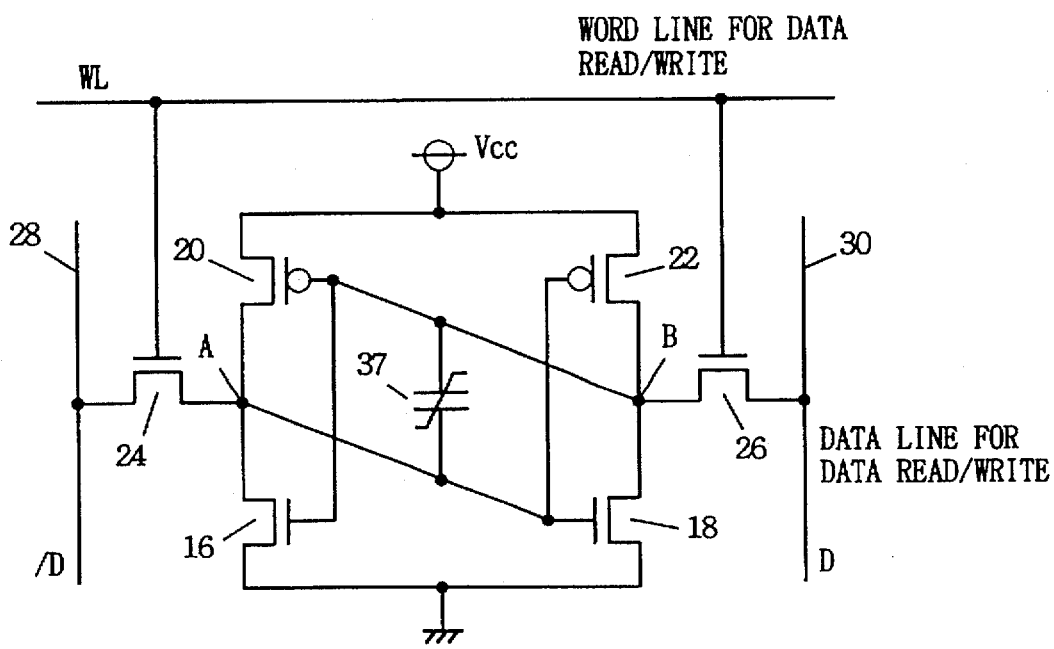

FIG. 2 shows a second embodiment of the present invention. In the second embodiment, the opposing electrodes of polarization are not connected to the fixed potential. The two electrodes of the capacitor are connected to respective opposing nodes. An effect similar to that of the first embodiment can be obtained with a more simple structure when used in other applications where the stored information in a memory cell is not rewritten frequently or when the power supply voltage is low enough.

For example, when node A and node B have data of an H level and an L level written therein, respectively, during the previous term of power on, there is a difference in the potential increase between nodes A and B when the power is turned on the next time since node A is polarized in the direction facilitating potential increase and node B in an opposite direction. According to this imbalance, the bistable element serves to further amplify the potential, so that the previously held information is directly reproduced. Thus, in the memory cell of the present structure, a rewriting operation is not required.

Although this memory cell is the so-called CMOS type cell, a similar effect can be obtained by an NMOS load type cell or a resistance load type cell.

Figure 5A:
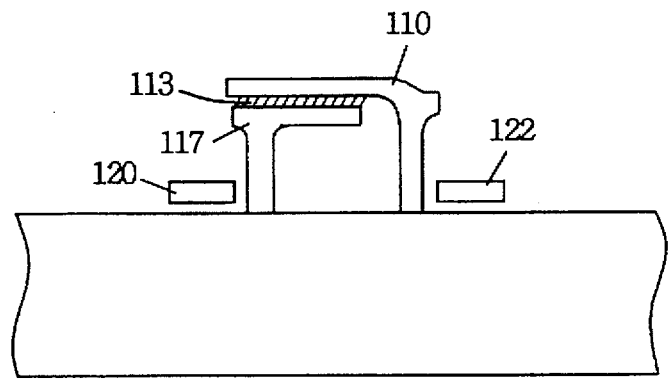
FIGS. 5A and 5B show the second embodiment of the present invention.
Figure 5B:
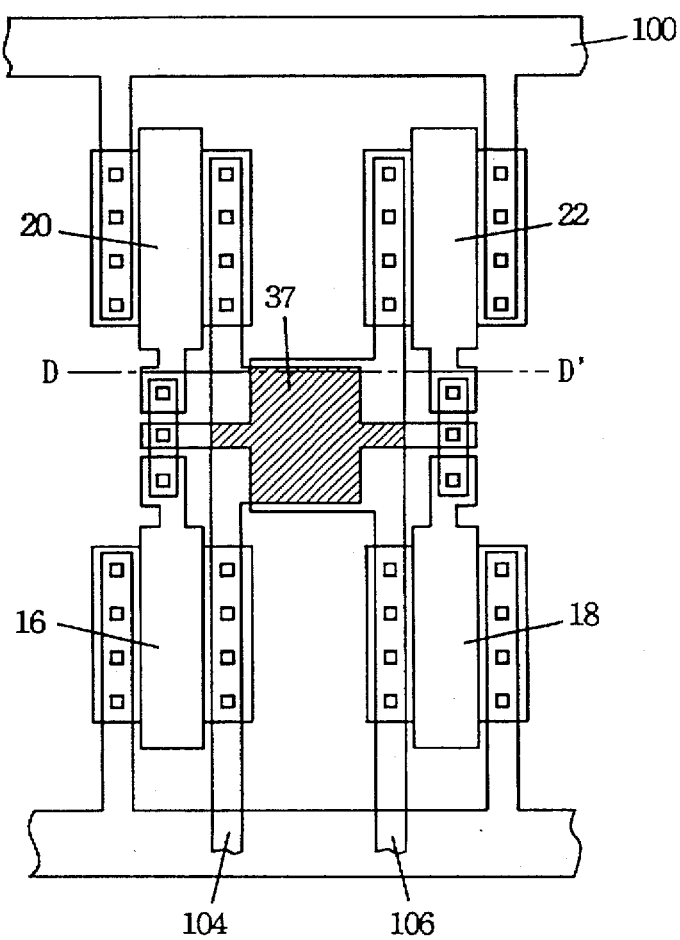

FIG. 5B is a plan view and FIG. 5A is a sectional view taken along the line D–D' of FIG. 5B of the second embodiment.

An interconnection connecting the drains of P channel MOSFET 20 and N channel MOSFET 16 to each other and drawn out as output node 104 is shared as lower electrode 117 in the ferroelectric capacitor.

A ferroelectric film formed on the interconnection is patterned to result in a dielectric film 117 in capacitor 37.

An upper electrode 110 is further formed thereon from which an electrode metal is drawn out simultaneously as output node 106.

Figure 6:
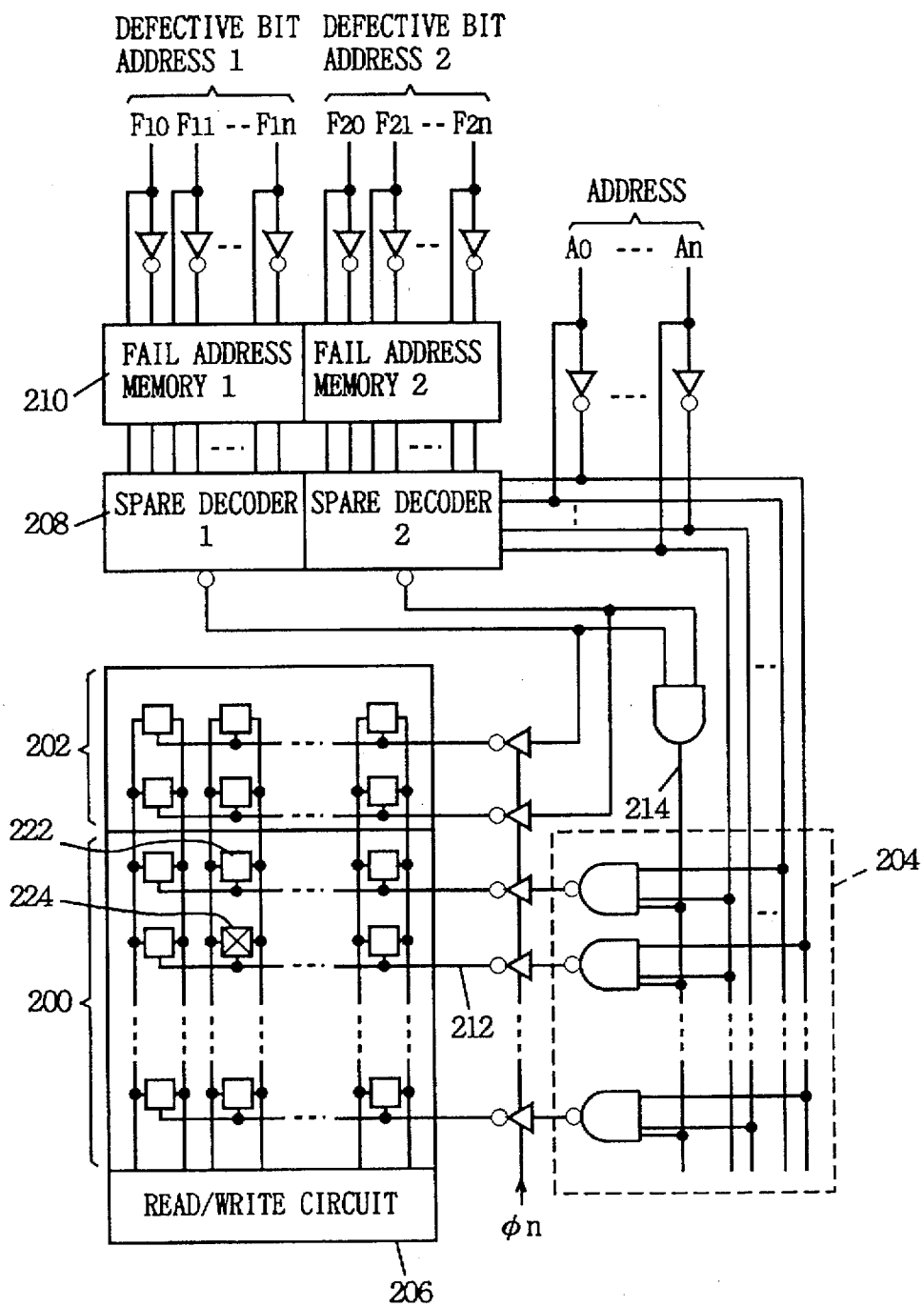
FIG. 6 is a block diagram schematically showing a third embodiment of the present invention.

FIG. 6 shows a structure of a redundancy circuit for a memory cell array according to a third embodiment of the present invention.

It has become extremely difficult to manufacture a memory array with no defective bits as the capacity of a memory is increased drastically. In a memory developed using novice manufacturing techniques, the defective level of the initial trial product is high with an extremely low yield.

In order to circumvent such problems, the redundancy circuit technique is used in practice in which several redundant rows and columns are added to be substituted for defective cells, rows, and columns.

FIG. 6 shows a circuit of a memory array including two redundant rows (spare rows). When there is a defective bit 224 in a regular array 200, a fail address memory 210 is programmed so as to carry out a select operation of the address signal corresponding to row 212 including the defective row. When addresses $F_{11}$, $F_{12}$ ... $F_{1n}$, or $F_{21}$, $F_{22}$ ... $F_{2n}$ including the defective bit are input, a spare decoder 208 is selected. Simultaneously, a select inhibit signal is provided to an select inhibit signal line 214 with respect to the regular row decoder. More specifically, one row in a row spare row array 202 is selected instead of the regular row 212.

Here, a read/write circuit 206 carries out data reading or writing, similar as to a proper array 200.

Conventionally, a non-volatile memory is formed by trimming a fuse element, for example, by laser as the fail address memory.

Figure 7:
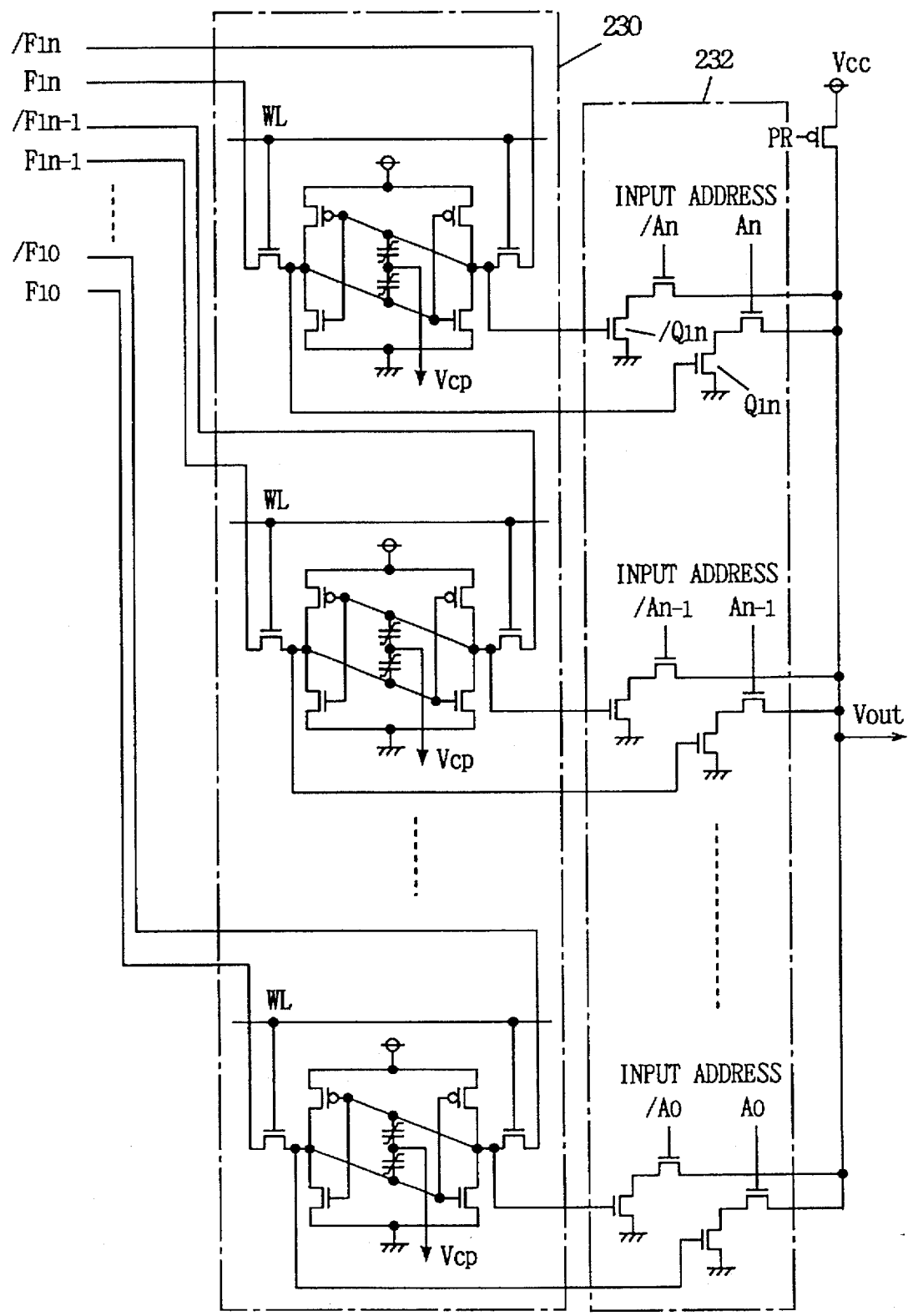
FIG. 7 is a circuit diagram showing the third embodiment of the present invention.

FIG. 7 is a circuit diagram showing a structure of the fail address memory of FIG. 6 formed by a non-volatile memory using the first memory cell of the present invention.

Following activation of a write word line WL, address $F_{10}$ ... $F_{IN}$ of a defective bit detected by an on-way testing after a wafer process is written into memory cell 230 as complementary programming addresses $F_{10}$, $/F_{10}$, ..., $F_{1n}$, $/F_{1n}$. This information is constantly transmitted to the side of a comparator circuit 232 to be applied to the gate of the N channel MOSFET. Therefore, one of the N channel MOSFETs is on, and the other is off. Prior to initiation of an operation, output $V_{OUT}$ is precharged to an H level by a precharge signal PR. Upon receiving an input address $A_0$ ... $A_n$, complementary internal addresses $A_0$, $/A_0$, ..., $A_n$, $/A_n$ generated inside the device attain an L level.

Therefore, there is no reduction in the potential of $V_{OUT}$ prior to initiation of an operation. This set is prepared corresponding to the number of groups of address signals required for the program in the circuit.

When an operation is initiated and an external address is applied, one of internal address $A_i$ or $/A_i$ (i=0, ..., n) attains an H level. When there is at least one mismatch with the programming address, the level of $V_{OUT}$ is lowered so that the spare address is not selected. When all the addresses match each other, the level of $V_{OUT}$ is not lowered, indicating that the selected memory cell is defective. In this case, spare decoder is activated, and normal decoder 204 is inactivated.

By using a memory element such as an non-volatile memory cell of the first and second embodiments as the fail address memory for a redundancy circuit, the area size can be reduced in comparison with that of a conventional fuse element. Also, programming can be facilitated.

Figure 8:
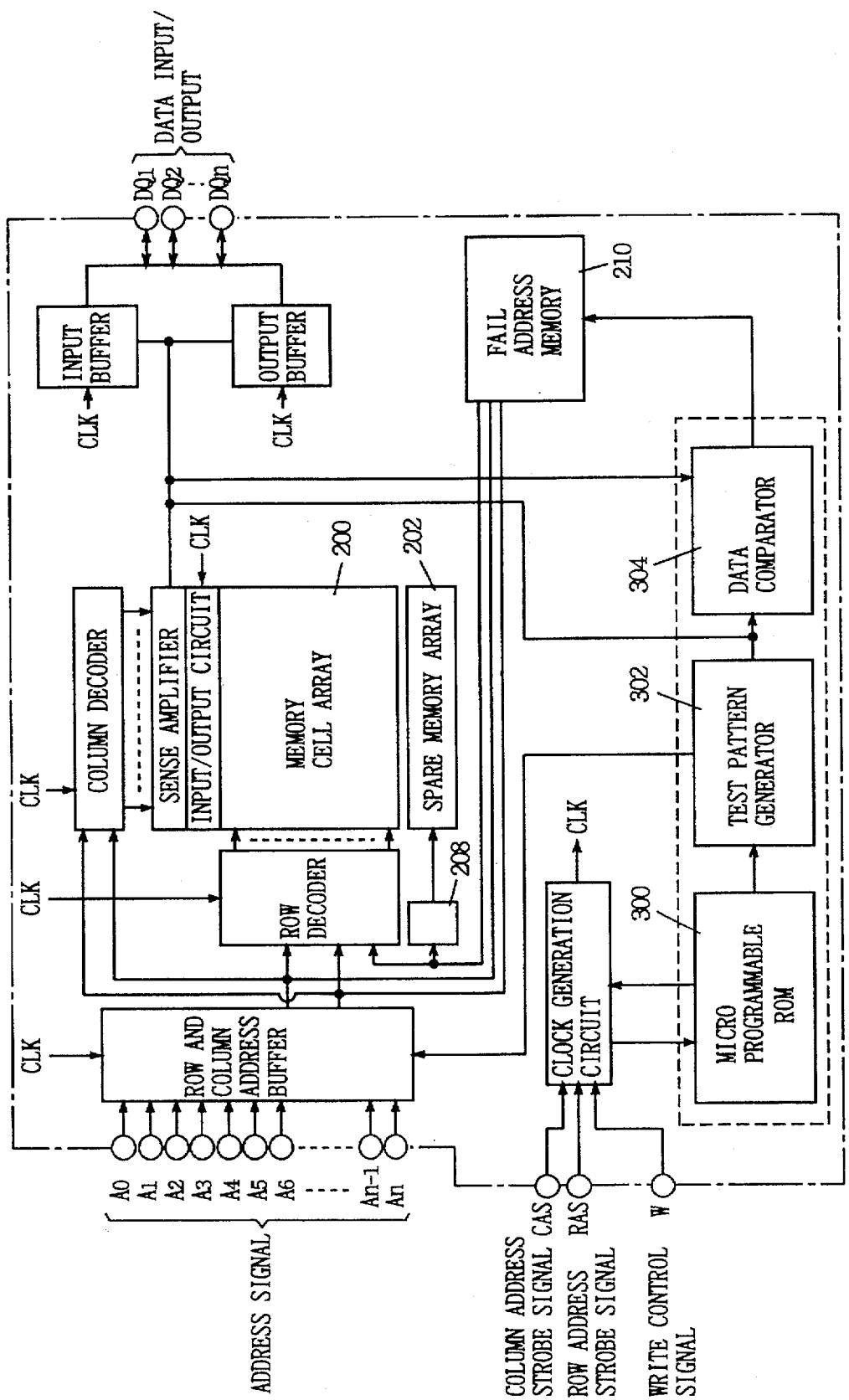
FIGS. 8 and 9 are block diagrams schematically showing a fourth embodiment, and a fifth embodiment, respectively, of the present invention.

FIG. 8 is a bock diagram schematically showing a fourth embodiment of the present invention.

In accordance with implementation of VLSI, the number of pins and the frequency have increased, neccesiating a more costly VLSI tester. The time required for the tester is lengthened due to increase of the applied test vector. The cost required for determining whether the product is acceptable or not is further increased.

The cost required for testing can be reduced significantly if the determination of a product can be carried out without having to use a VISI tester or a great amount of test vectors. This is possible by incorporating a self-testing mechanism within the chip. Such a system is called BIST (Built-In Self Testing).

A circuit carrying out BIST is disposed in a memory array including a regular memory cell array and a spare memory cell array. Referring to FIG. 4, a test pattern generating circuit 302 controlled by a microprogrammable ROM 300 applies test data to memory cell array 200 in a self testing operation. By comparing the output and input data of memory cell array 200 using a comparator 304, a determined defective address is transferred to fail address memory 210, and an address to be substituted in spare memory array 202 is accorded thereto. Similar to the third embodiment, a fail memory address memory is formed in the present fourth embodiment using the memory cell shown in the first and second embodiments. Since an arbitrarily writing operation is allowed when the memory cell shown in the first and second embodiments is used, a newly generated defect can be detected to be repaired by carrying out a BIST at an arbitrary cycle.

Figure 9:
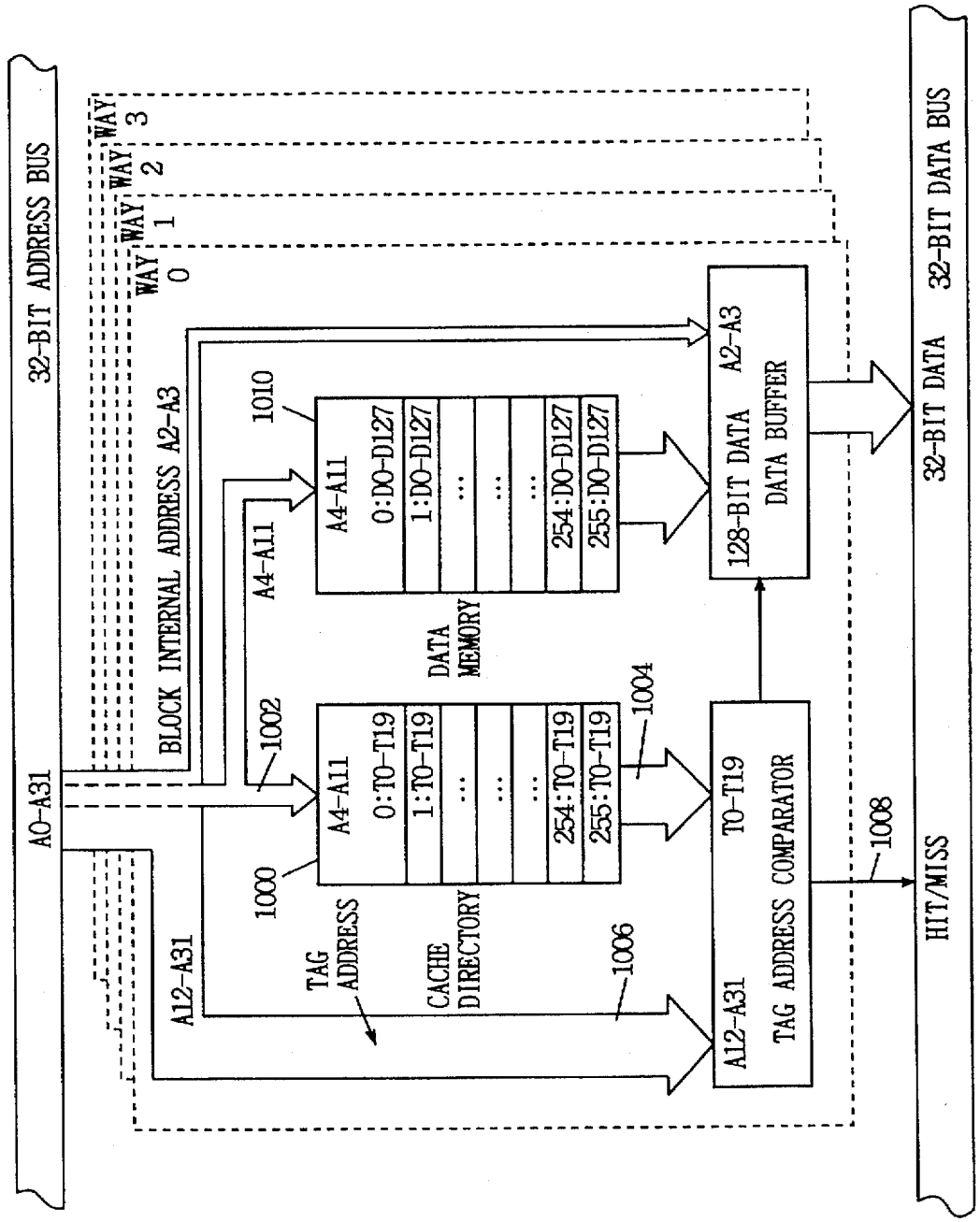

FIG. 9 is a block diagram schematically showing a fifth embodiment of the present invention.

Although the capacity and the speed of a memory have evolved tremendously, the speed of a large main memory is not so high with the respect to the speed of a CPU in a computer system. The speed of the system itself cannot satisfy the requirement of a high speed CPU in a bus of a great amplitude such as a TTL interface level. In order to solve such a problem, an approach was taken in which a small but a high speed buffer (cache memory) is placed in the proximity of a CPU with the bus divided in for the CPU and for the system. A portion of the data of the main memory is stored in the cache memory with which the CPU mainly communicates.

In the present embodiment, a memory including the memory cell of the first and second embodiments is used as the cache directory and data memory in the cache memory.

It is assumed that the cache memory is accessed from the CPU by an address signal of 32 bits, for example.

In a cache directory 1000, the addresses of high significance (tag address) of the main memory corresponding to the data stored in a data memory 1010 are stored. The address in cache directory 1000 is selected by an address of low significance (A4–A11; set address) 1002 from the CPU. The number of tag addresses selected by the same set address 1002 is called the number of ways. In the present example, the tag address is selected by A0, A1. The data read out from the cache directory 1000 is compared with tag address 1006 from the CPU. The cache is said to be "hit" when the compared values match each other. A "hit" implies that valid data specified by the tag address and the set address is present in the data memory. Therefore, a hit signal 1008 is generated to notify valid access to the data memory. In the case of a mismatch (cache miss), the cache directory and the data memory are updated by the data in the main memory.

According to the above-described operation, data in a cache memory can be accessed as if it exists in the main memory viewed from the CPU.

By forming the cache directory and the data memory with the memory cell of the first and second embodiments of the present invention, the previous data can be restored when the power is turned on again.

Figure 12:
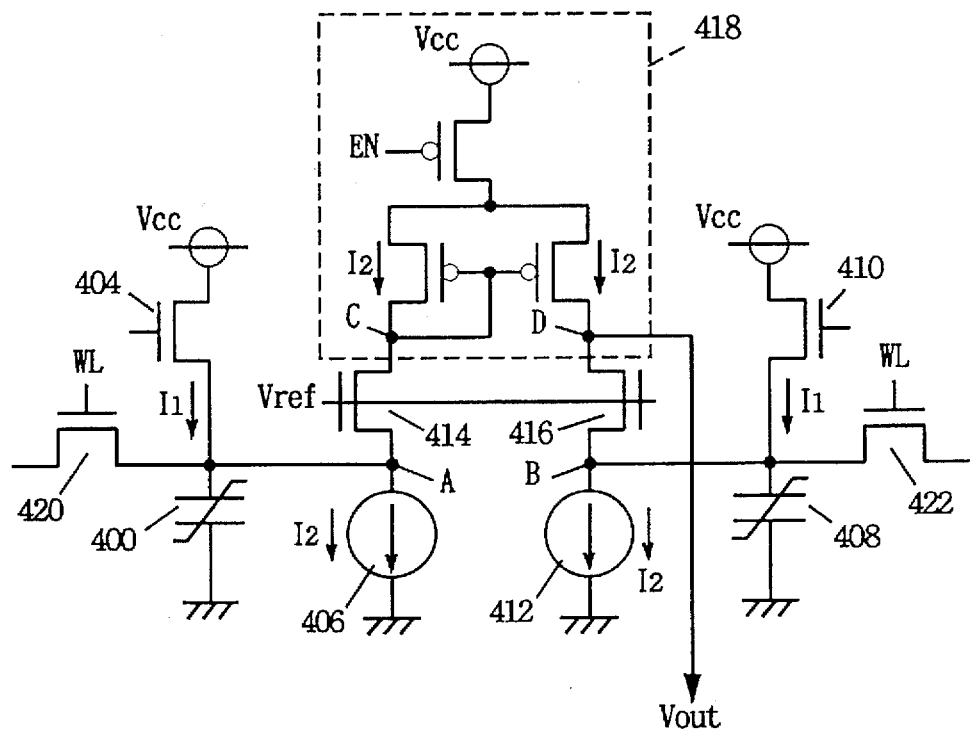
FIG. 12 is a circuit diagram of the sixth embodiment of the present invention.

FIG. 12 shows a memory cell according to the sixth embodiment of the present invention.

Figure 10:
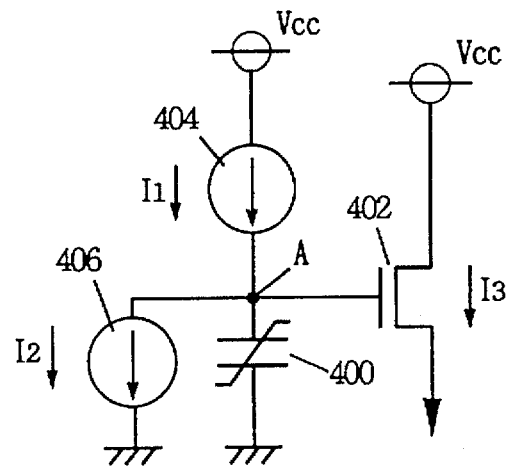
FIG. 10 is a circuit diagram for describing an operation of the sixth embodiment of the present invention.

FIG. 12 shows a complementary type circuit. Prior to the description of the operation of the circuit of FIG. 11, the operation of the basic components thereof will be described with the reference to FIG. 10 showing the basic components and the timing chart of FIG. 11 showing the operation thereof.

Figure 11:
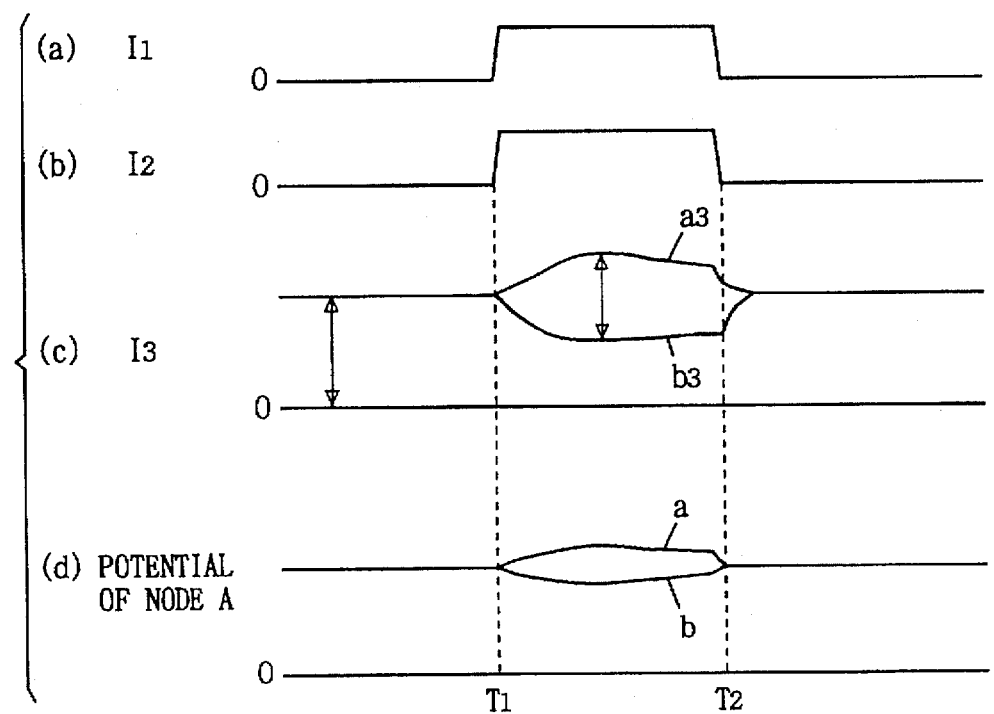
FIG. 11 is a timing chart for describing an operation of the sixth embodiment.

In FIG. 11, (a), (b), (c), and (d) show the change over time of current $I_1$ through a constant current source 404, current $I_2$ through a constant current source 406, current $I_3$ through a transistor 402, and the potential at node A, respectively.

First and second constant current sources 404 and 406 are connected in series. A ferroelectric capacitor 400 polarized in a first or second direction has one end connected to the node of first and second constant current sources 404 and 406.

In the present example, the other end of the ferroelectric capacitor is connected to ground.

At time $T_1$, constant currents $I_1$ and $I_2$ are conducted to constant current sources 404 and 406, respectively.

Figure 16:
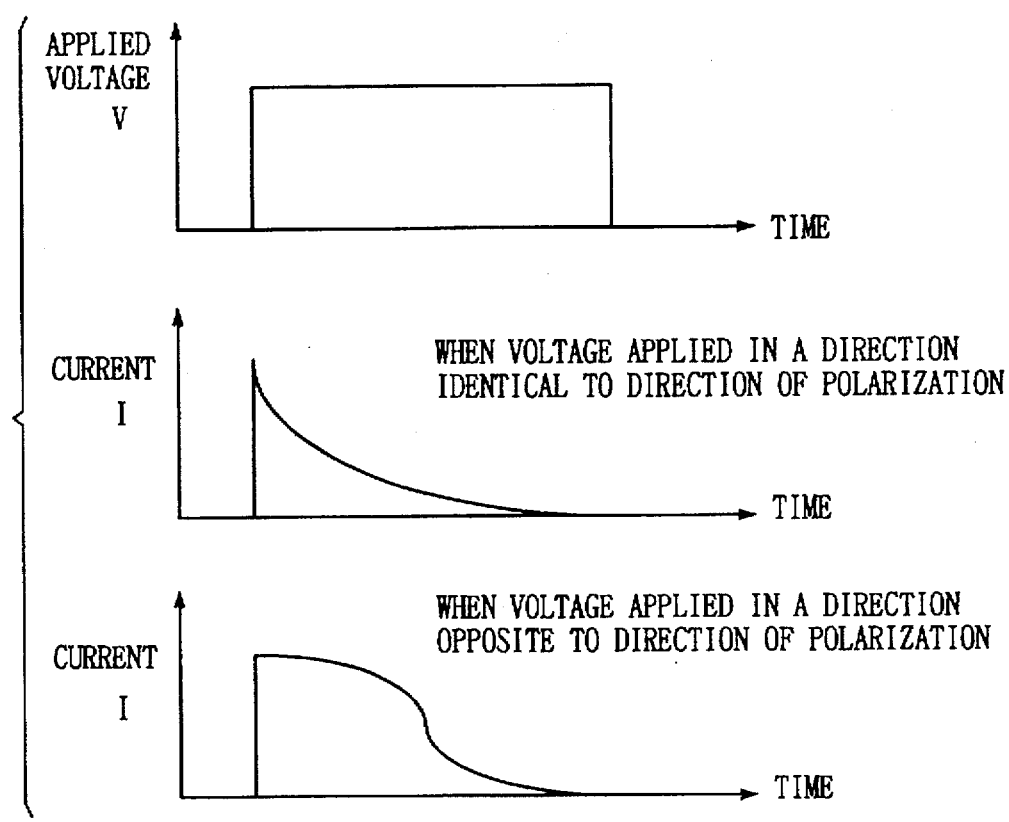
FIG. 16 shows the relationship of the direction of polarization of ferroelectrics and current over time.

If the direction of polarization of capacitor 400 is identical to the direction of the current, the charging operation is quickly terminated as shown in FIG. 16, so that the potential at node A begins to rise. Thus, a change as shown in "a" in FIG. 11(d) is exhibited.

If the direction of polarization is opposite to the direction of the current, an amount of current greater than the above-described case is conducted to the capacitor as shown in FIG. 16, so that the potential at node A is lowered. Thus, a transition as shown in "b" in FIG. 11(d) is exhibited.

By coupling the potential of node A to the gate of N channel MOSFET 402, for example, the current flowing across N channel MOSFET 402 also increases/decrease according to the potential change thereof.

Figure 13:
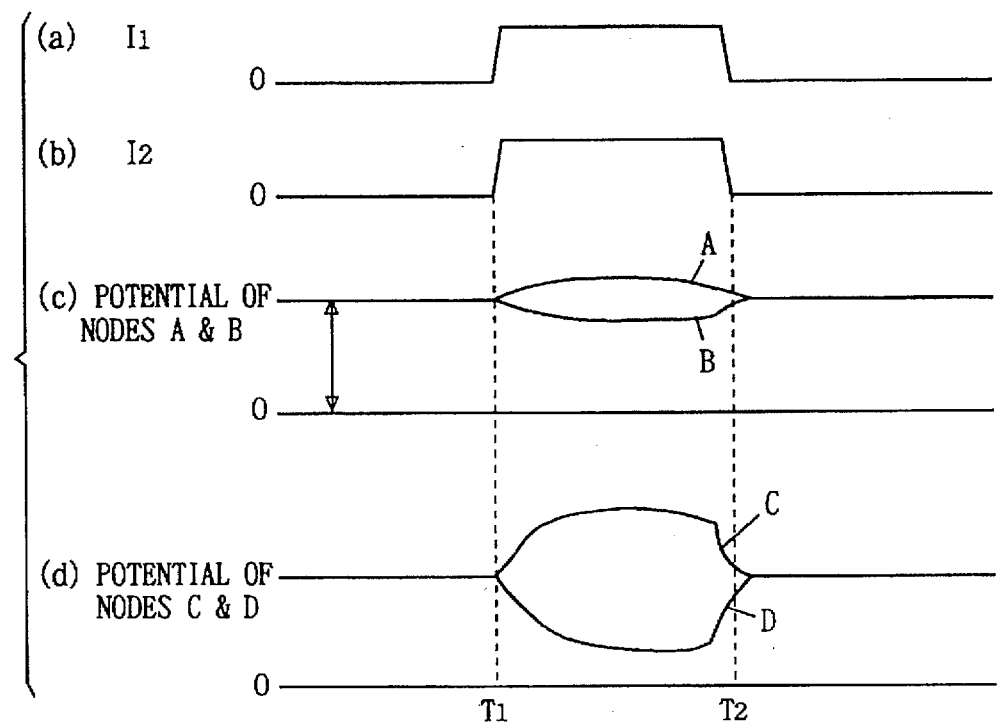
FIG. 13 is a timing chart showing an operation of the sixth embodiment of the present invention.

In order to detect the above-described potential change with high sensitivity, a complementary type circuit of a configuration shown in FIG. 12 is implemented. FIG. 13 is a timing chart showing the operation thereof.

In FIG. 13, (a), (b), (c), and (d) show the change over time of current $I_1$ flowing through transistors 404 and 410, current $I_2$ flowing through constant current sources 406 and 412, the potential at nodes A and B, and the potential at nodes C and D, respectively.

It is assumed that transistors 420 and 422 are turned on by a word line activation signal WL to apply complementary voltages to capacitors 400 and 408, whereby each capacitor is polarized in opposite directions.

At time $T_1$, current $I_1$ is conducted to transistors 404 and 410 coupled to first and third constant current sources, respectively.

Simultaneously, second and fourth constant current sources 406 and 412 begin to conduct currents $I_2$.

Here, it is assumed that the current flowing to constant sources 406 and 412 are maintained at a constant value equal to each other by a current mirror circuit 418.

When capacitor 400 is polarized in the direction identical to the current and capacitor 408 is polarized in the direction opposite to the current, the potential of node A rises, and the potential of node B is lowered, as described with reference to FIG. 11.

Since current mirror circuit 418 is connected to constant current sources 406 and 412 via an N channel MOSFET to which current $V_{ref}$ is applied, the impedance between nodes A and C, and the impedance between nodes B and D is high.

Therefore, the potential change which is an amplified version of the potential change of nodes A and B appears at nodes C and D.

Stored information in a memory cell can be read out by reading the difference of the potential between nodes D and C as output $V_{OUT}$.

Thus, the information stored in a ferroelectric capacitor can be read out at high accuracy with a circuit of a relatively simple configuration and operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory cell that can store information in a non-volatile manner, comprising:

a plurality of bit line pairs, a plurality of word lines crossing said bit line pairs, a plurality of bistable memory elements arranged in corresponding crossing of said bit line pairs and said word lines, each of said bistable memory elements including a first amplifying circuit having an input and an output, and a second amplifying circuit having an output and an input coupled to said input and said output, respectively, of said first amplifying circuit, a node to which a fixed potential is supplied, a first data output node coupled to said output of said first amplifying circuit, a second data output node coupled to said output of said second amplifying circuit, a first ferroelectric capacitor having one end coupled to said second data output node and the other end coupled to said node to which said fixed potential is supplied, a second ferroelectric capacitor having one end coupled to said first data output node and the other end coupled to said node to which said fixed potential is supplied, a first access transistor connected between said first data output node and the first bit line of one of said bit line pairs, and a second access transistor connected between said data output node and the second bit line pairing with said first bit line, and each of said first and said second access transistors being controlled to be conductive/nonconductive by a potential of corresponding said word line, a plurality of first data output lines, each connected to corresponding said first data output node, and a plurality of second data output lines, each connected to corresponding said second data output node.

2. A memory cell that can store information in a nonvolatile manner, comprising:

a bistable memory element including a first amplifying circuit having an input and an output and a second amplifying circuit having an output and an input coupled to said input and said output, respectively, of said first amplifying circuit, and a ferroelectric capacitor having one end connected between the input of the first amplifying circuit and the output of the second amplifying circuit, and the other end connected between the input of said second amplifying circuit and the output of the first amplifying circuit.

3. A semiconductor memory device having a redundancy function, comprising:

a main memory cell array in which a plurality of memory cells are arranged, means responsive to an external input address signal for reading or writing information of one cell in said memory cell array, a spare memory cell array formed of a plurality of memory cells each having a structure identical to that of said memory cell of said main memory cell array, spare cell selecting means for reading/writing information of a corresponding cell in said spare memory cell array when said input address signal corresponds to a defective cell in said main memory cell array, wherein said spare cell selecting means includes spare decoding means for comparing said external input address signal with an address of said defective cell, and selecting said corresponding cell in said spare memory cell array, and defective bit address storing means for storing and outputting said address of said defective cell, wherein said defective bit address storing means includes a plurality of bit line pairs, a plurality of word lines crossing said bit line pairs, a plurality of bistable memory elements arranged in corresponding crossing points of said bit line pairs and said word lines, each of said bistable memory elements including a first amplifying circuit having an input and an output, and a second amplifying circuit having an output and an input coupled to said input and said output, respectively, of said first amplifying circuit, a node to which a fixed potential is supplied, a first data output node coupled to said output of said first amplifying circuit, a second data output node coupled to said output of said second amplifying circuit, a first ferroelectric capacitor having one end coupled to said second data output node and the other end coupled to said node to which said fixed potential is supplied, a second ferroelectric capacitor having one end coupled to said first data output node and the other end coupled to said node to which said fixed potential is supplied, a first access transistor connected between said first data output node and the first bit line of one of said bit line pairs, and a second access transistor connected between said second data output node and the second bit line pairing with said first bit line, and each of said first and second access transistors being controlled to be conductive/nonconductive by a potential of corresponding said word line, said defective bit address storing means further includes, a plurality of first data output lines, each connected between said spare decoding means and said first data output node of corresponding said bistable memory element, and a plurality of second data output lines, each connected between said spare decoding means and said first data output node of corresponding said bistable memory element, and each pair of said first and second data output lines providing corresponding complimentary bit data of said address of said defective cell.

4. A semiconductor memory device including a redundancy function comprising:

a main memory cell array in which a plurality of memory cells are arranged, means responsive to an external input address signal for reading or writing information of one cell in said memory cell array, a spare memory cell array formed of a plurality of memory cells each having a structure identical to that of said memory cell of said main memory cell array, spare cell selecting means for reading or writing information of a corresponding cell in said spare memory cell array when said input address signal corresponds to a defective cell in said main memory cell array, wherein said spare cell selecting means includes spare decoding means for comparing said external input address signal with an address of said defective cell, and selecting said corresponding cell in said spare memory cell array, and defective bit address storing means for storing and outputting said address of said defective cell, wherein said defective bit address storing means includes a bistable memory element including a first amplifying circuit having an output and an input, and a second amplifying circuit having an output and an input coupled to said input and output, respectively, of said first amplifying circuit, and a ferroelectric capacitor having one end connected between the input of the first amplifying circuit and the output of the second amplifying circuit, and the other end connected between the input of the second amplifying circuit and the output of the first amplifying circuit.

5. A semiconductor memory device located in a data transition path between a central processing unit and a main memory unit, said semiconductor memory device having stored data in said main memory unit partially transferred thereto, and to which said central processing unit accesses prior to said main memory unit in a range of said transferred stored data, said semiconductor memory device comprising:

a memory cell array in which a plurality of memory cells are arranged, wherein each of said plurality of memory cells comprises a bistable memory element including a first amplifying circuit having an input and an output, and a second amplifying circuit having an output and an input coupled to said input and said output, respectively, of said first amplifying circuit, and a ferroelectric capacitor having one end connected between the input of the first amplifying circuit and the output of the second amplifying circuit, and the other end connected between the input of the second amplifying circuit and the output of the first amplifying circuit.

6. A semiconductor memory device having a redundancy function, comprising:

a main memory cell array in which a plurality of memory cell are arranged, selecting means responsive to an external input address signal for reading or writing information of one cell in said main memory cell array, means for transmitting a pseudo address signal to said selecting means to write/read information, and carrying out self testing of an acceptable/defective memory cell, a spare memory cell array formed of a plurality of memory cells each having a structure identical to that of said memory cell of said main memory cell array, means for determining correspondence of an address of a defective cell in said main memory cell array with an address in a memory cell to be substituted in said spare memory cell array according to a result of said self testing, spare cell selecting means for reading/writing information of a corresponding cell in said spare memory cell array when said external input address signal corresponds to a defective cell in said main memory cell array, and means for storing correspondence of said address of a defective cell with said address of a memory cell to be substituted in the spare memory cell array, wherein said means for storing correspondence of addresses includes, a plurality of bit line pairs, a plurality of word lines crossing said bit line pairs, a plurality of bistable memory elements arranged in corresponding crossing points of said bit line pairs and said word lines, each of said bistable memory elements including, a first amplifying circuit having an input and an output, and a second amplifying circuit having an output and an input coupled to said input and said output, respectively, of said first amplifying circuit, a node to which a fixed potential is supplied, a first data output node coupled to said output of said first amplifying circuit, a second data output node coupled to said output of said second amplifying circuit, a first ferroelectric capacitor having one end coupled to said second data output node and the other end coupled to said node to which said fixed potential is supplied, a second ferroelectric capacitor having one end coupled to said first data output node and the other end coupled to said node to which said fixed potential is supplied, a first access transistor connected between said first data output node and the first bit line of one of said bit line pairs, and a second access transistor connected between said second data output node and the second bit line pairing with said first bit line, and each of said first and said second access transistors being controlled to be conductive/nonconductive by a potential of corresponding said word line, said means for storing correspondence of address further includes, a plurality of first data output lines, each connected between said spare cell selecting means and said first data output node of corresponding said bistable memory element, and a plurality of second data output lines, each connected between said spare cell selecting means and said first data output node of corresponding said bistable memory element, and each pair of said first and said second data output lines providing corresponding complimentary bit data of said address of said defective cell.

7. A semiconductor memory device having a redundancy function, comprising:

a memory cell array in which a plurality of a memory cells are arranged, selecting means responsive to an external input address signal for reading or writing information of one cell in said main memory cell array, means for transmitting a pseudo address signal to said reading/writing means of cell information to read/write information, and carrying out self testing of an acceptable/defective memory cell, a spare memory cell array formed of a plurality of memory cells each having a structure identical to that of said memory cell of said main memory cell array, means for determining correspondence of an address of a defective cell in said main memory cell array with an address in a memory cell to be substituted in said auxiliary memory cell array according to a result of said self testing, spare cell selecting means for reading/writing information of a corresponding cell in said spare memory cell array when said external input address signal corresponds to a defective cell in said main memory cell array, and means for storing correspondence of said address of the defective cell with said address of a memory cell to be substituted in said spare memory cell array, wherein said means for storing correspondence of addresses includes, a bistable memory element including a first amplifying circuit having an input and an output, and a second amplifying circuit having an output and an input coupled to said input and said output, respectively, of said first amplifying circuit, and a ferroelectric capacitor having one end connected between the input of the first amplifying circuit and the output of the second amplifying circuit, and the other end connected between the input of said second amplifying circuit and the output of the first amplifying circuit.

8. A semiconductor memory device including a plurality of memory cells storing information according to direction of spontaneous polarization of ferroelectrics, wherein each of said plurality of memory cells comprises a pair of first and second ferroelectric capacitors having each one end connected to a first potential, polarization means for polarizing said first and second ferroelectric capacitors in directions complementary to each other, a first path including serially connected first and second constant current sources, and having a connection node of said first and second constant current sources connected to the other end of said first ferroelectric capacitor, a second path including serially connected third and fourth constant current sources, and having a connection node of said third and fourth constant current sources connected to the other end of said second ferroelectric capacitor, wherein said first and second paths comprise means for maintaining the values of currents flowing through said second and fourth constant current sources in both paths equal, wherein said semiconductor memory device comprises, for at least every one of said memory cell, potential difference detection means for detecting difference between a potential of the connection node of said first and second constant current sources and a potential of the connection node of said third and fourth constant current sources.

9. The semiconductor memory device according to claim 8, wherein said means for maintaining the constant current flow equal in said first and second paths comprises a current mirror circuit of a pair of two MOSFETs, having one output end connected to the connection node of said first and second constant current sources, and the other one output end connected to the connection node of said third and fourth constant current sources.

10. A semiconductor memory device including a plurality of memory cells storing information according to direction of spontaneous polarization of ferroelectrics, wherein each of said plurality of memory cells comprises a ferroelectric capacitor having one end connected to a first potential, polarization means for polarizing said ferroelectric capacitors, a current path including serially connected first and second constant current sources, and having a connection node of said first and second constant current sources connected to the other end of said first ferroelectric capacitor, wherein said semiconductor memory device comprises, for at least every one of said memory cell, potential detection means for detecting a change of a potential level of the connection node of said first and second current sources.

11. The semiconductor memory device according to claim 10, wherein said potential detection means includes a MOS transistor having a gate connected to said connection node and having the drain-to-source current controlled by said potential level of the connection node, wherein said potential detection means detects said change of the potential level of the connection node by means of sensing said drain-to-source current.

12. The semiconductor memory device according to claim 10, wherein said potential detection means includes a MOS transistor having a source connected to said connection node, a drain connected to a current source and a gate the potential of which is controlled to be a predetermined level, wherein said potential detection means detects said change of the potential level of the connection node by means of sensing a potential level of said drain.

* * * * *